US00RE46933E

(19) United States
(12) Reissued Patent
Van Den Brink et al.

(10) Patent Number: US RE46,933 E
(45) Date of Reissued Patent: *Jul. 3, 2018

(54) DUAL STAGE LITHOGRAPHIC APPARATUS AND DEVICE MANUFACTURING METHOD

(71) Applicant: ASML NETHERLANDS B.V., Veldhoven (NL)

(72) Inventors: Marinus Aart Van Den Brink, Moergestel (NL); Jozef Petrus Henricus Benschop, Veldhoven (NL); Erik Roelof Loopstra, Eindhoven (NL)

(73) Assignee: ASML NETHERLANDS B.V., Veldhoven (NL)

( * ) Notice: This patent is subject to a terminal disclaimer.

(21) Appl. No.: 14/715,314

(22) Filed: May 18, 2015

Related U.S. Patent Documents

Reissue of:
(64) Patent No.: 7,161,659
Issued: Jan. 9, 2007
Appl. No.: 11/135,655
Filed: May 24, 2005

U.S. Applications:
(63) Continuation of application No. 13/970,429, filed on Aug. 19, 2013, now Pat. No. Re. 45,576, which is a
(Continued)

(51) Int. Cl.
*G03B 27/42* (2006.01)
*G03B 27/52* (2006.01)
(Continued)

(52) U.S. Cl.
CPC ..... *G03F 7/70058* (2013.01); *G03F 7/70066* (2013.01)

(58) Field of Classification Search
CPC ..... G03B 27/42; G03B 27/52; G03B 27/58
(Continued)

(56) References Cited

U.S. PATENT DOCUMENTS 4,346,164 A 8/1982 Tabarelli et al.
4,465,368 A 8/1984 Matsuura et al.
(Continued)

FOREIGN PATENT DOCUMENTS

DE 221 563 A1 9/1983
DE 224 448 A1 7/1985
(Continued)

OTHER PUBLICATIONS

Preliminary Amendment filed on Jan. 8, 2008 in U.S. Appl. No. 11/785,716 of Ebihara.
(Continued)

*Primary Examiner* — Tuan H Nguyen
(74) *Attorney, Agent, or Firm* — Pillsbury Winthrop Shaw Pittman LLP

(57) ABSTRACT

The invention relates to a dual stage lithographic apparatus, wherein two substrate stages are constructed and arranged for mutual cooperation in order to perform a joint scan movement. The joint scan movement brings the lithographic apparatus from a first configuration, wherein immersion liquid is confined between a first substrate held by the first stage of the stages and a projection system of the apparatus, to a second configuration, wherein the immersion liquid is confined between a second substrate held by the second stage of the two stages and the projection system, such that during the joint scan movement the liquid is essentially confined within the space with respect to the projection system.

20 Claims, 9 Drawing Sheets

Related U.S. Application Data continuation of application No. 13/584,522, filed on Aug. 13, 2012, now Pat. No. Re. 44,446, which is a continuation of application No. 12/318,821, filed on Jan. 8, 2009, now Pat. No. Re. 43,576, which is an application for the reissue of Pat. No. 7,161,659, which is a continuation-in-part of application No. 11/101,631, filed on Apr. 8, 2005, now abandoned.

(51) Int. Cl.
*G03B 27/58* (2006.01)
*G03F 7/20* (2006.01)

(58) Field of Classification Search
USPC ..... 355/53, 55, 30, 67, 72
See application file for complete search history.

(56) References Cited

U.S. PATENT DOCUMENTS 4,480,910 A 11/1984 Takanashi et al.
5,121,256 A 6/1992 Corle et al.
5,243,195 A 9/1993 Nishi
5,610,683 A 3/1997 Takahashi et al.
5,650,840 A 7/1997 Taniguchi
5,715,039 A 2/1998 Fukuda et al.
5,825,043 A 10/1998 Suwa
5,969,441 A 10/1999 Loopstra et al.
6,137,561 A 10/2000 Imai
6,262,796 B1 7/2001 Loopstra et al.
6,341,007 B1 1/2002 Nishi et al.
6,400,441 B1 6/2002 Nishi et al.
6,417,914 B1 7/2002 Li
6,665,054 B2 12/2003 Inoue
6,897,963 B1 5/2005 Taniguchi et al.
7,075,616 B2 7/2006 Derksen et al.
7,098,991 B2 8/2006 Nagasaka et al.
7,119,876 B2 10/2006 Van Der Toorn et al.
7,199,858 B2 4/2007 Lof et al.
7,321,419 B2 1/2008 Ebihara
7,349,069 B2 3/2008 Beems et al.
7,388,649 B2 6/2008 Kobayashi et al.
7,405,811 B2 7/2008 Beems et al.
7,456,929 B2 11/2008 Shibuta
7,515,281 B2 4/2009 Loopstra et al.
7,528,931 B2 5/2009 Modderman
7,589,820 B2 9/2009 Nei et al.
7,589,822 B2 * 9/2009 Shibazaki ..... G03F 7/70341 355/53
7,982,857 B2 7/2011 Nishii et al.
8,018,575 B2 9/2011 Ebihara
8,027,027 B2 9/2011 Ebihara
RE43,576 E 8/2012 Van Den Brink et al.
RE44,446 E 8/2013 Van Den Brink et al.
2002/0041377 A1 4/2002 Hagiwara et al.
2002/0061469 A1 5/2002 Tanaka
2002/0163629 A1 11/2002 Switkes et al.
2002/0196421 A1 12/2002 Tanaka et al.
2003/0030916 A1 2/2003 Suenaga
2003/0076482 A1 4/2003 Inoue
2003/0117596 A1 6/2003 Nishi
2003/0128350 A1 7/2003 Tanaka
2003/0174408 A1 9/2003 Rostalski et al.
2004/0000627 A1 1/2004 Schuster
2004/0075895 A1 4/2004 Lin
2004/0109237 A1 6/2004 Epple et al.
2004/0114117 A1 6/2004 Bleeker
2004/0118184 A1 6/2004 Violette
2004/0119954 A1 6/2004 Kawashima et al.
2004/0125351 A1 7/2004 Krautschik
2004/0136494 A1 7/2004 Lof et al.
2004/0160582 A1 8/2004 Lof et al.
2004/0165159 A1 8/2004 Lof et al.
2004/0169834 A1 9/2004 Richter et al.
2004/0169924 A1 9/2004 Flagello et al.
2004/0180294 A1 9/2004 Baba-Ali et al.
2004/0180299 A1 9/2004 Rolland et al.
2004/0207824 A1 10/2004 Lof et al.
2004/0211920 A1 10/2004 Maria Derkson et al.
2004/0224265 A1 11/2004 Endo et al.
2004/0224525 A1 11/2004 Endo et al.
2004/0227923 A1 11/2004 Flagello et al.
2004/0233405 A1 11/2004 Kato et al.
2004/0253547 A1 12/2004 Endo et al.
2004/0253548 A1 12/2004 Endo et al.
2004/0257544 A1 12/2004 Vogel et al.
2004/0259008 A1 12/2004 Endo et al.
2004/0259040 A1 12/2004 Endo et al.
2004/0263808 A1 12/2004 Sewell
2004/0263809 A1 12/2004 Nakano
2005/0002004 A1 1/2005 Kolesnychenko et al.
2005/0007569 A1 1/2005 Streefkerk et al.
2005/0007570 A1 1/2005 Streefkerk et al.
2005/0018155 A1 1/2005 Cox et al.
2005/0018156 A1 1/2005 Mulkens et al.
2005/0024609 A1 2/2005 De Smit et al.
2005/0030497 A1 2/2005 Nakamura
2005/0030498 A1 2/2005 Mulkens
2005/0030506 A1 2/2005 Schuster
2005/0030511 A1 2/2005 Auer-Jongepier et al.
2005/0036121 A1 2/2005 Hoogendam et al.
2005/0036183 A1 2/2005 Yeo et al.
2005/0036184 A1 2/2005 Yeo et al.
2005/0036213 A1 2/2005 Mann et al.
2005/0037269 A1 2/2005 Levinson
2005/0041225 A1 2/2005 Sengers et al.
2005/0042554 A1 2/2005 Dierichs et al.
2005/0046813 A1 3/2005 Streefkerk et al.
2005/0046934 A1 3/2005 Ho et al.
2005/0048220 A1 3/2005 Mertens et al.
2005/0048223 A1 3/2005 Pawloski et al.
2005/0068639 A1 3/2005 Pierra et al.
2005/0073670 A1 4/2005 Carroll
2005/0074704 A1 4/2005 Endo et al.
2005/0078286 A1 4/2005 Dierichs et al.
2005/0078287 A1 4/2005 Sengers et al.
2005/0084794 A1 4/2005 Meagley et al.
2005/0088635 A1 4/2005 Hoogendam et al.
2005/0094114 A1 5/2005 Streefkerk et al.
2005/0094116 A1 5/2005 Flagello et al.
2005/0094119 A1 5/2005 Loopstra et al.
2005/0094125 A1 5/2005 Arai
2005/0100745 A1 5/2005 Lin et al.
2005/0106512 A1 5/2005 Endo et al.
2005/0110973 A1 5/2005 Streefkerk et al.
2005/0117135 A1 6/2005 Verhoeven et al.
2005/0117224 A1 6/2005 Shafer et al.
2005/0122497 A1 6/2005 Lyons et al.
2005/0122505 A1 6/2005 Miyajima
2005/0128445 A1 6/2005 Hoogendam et al.
2005/0132914 A1 6/2005 Mulkens et al.
2005/0134815 A1 6/2005 Van Santen et al.
2005/0134817 A1 6/2005 Nakamura
2005/0136361 A1 6/2005 Endo et al.
2005/0141098 A1 6/2005 Schuster
2005/0145265 A1 7/2005 Ravkin et al.
2005/0145803 A1 7/2005 Hakey et al.
2005/0146693 A1 7/2005 Ohsaki
2005/0146694 A1 7/2005 Tokita
2005/0146695 A1 7/2005 Kawakami
2005/0147920 A1 7/2005 Lin et al.
2005/0153424 A1 7/2005 Coon
2005/0158673 A1 7/2005 Hakey et al.
2005/0164502 A1 7/2005 Deng et al.
2005/0174549 A1 8/2005 Duineveld et al.
2005/0174550 A1 8/2005 Streefkerk et al.
2005/0175776 A1 8/2005 Streefkerk et al.
2005/0175940 A1 8/2005 Dierichs
2005/0179877 A1 8/2005 Mulkens et al.
2005/0185269 A1 8/2005 Epple et al.
2005/0190435 A1 9/2005 Shafer et al.
2005/0190455 A1 9/2005 Rostalski et al.
2005/0205108 A1 9/2005 Chang et al.
2005/0213061 A1 9/2005 Hakey et al.

(56) References Cited

U.S. PATENT DOCUMENTS

| | | | | |
|---|---|---|---|---|
| 2005/0213072 | A1 | 9/2005 | Schenker et al. | |
| 2005/0217135 | A1 | 10/2005 | O'Donnell et al. | |
| 2005/0217137 | A1 | 10/2005 | Smith et al. | |
| 2005/0217703 | A1 | 10/2005 | O'Donnell | |
| 2005/0219481 | A1 | 10/2005 | Cox et al. | |
| 2005/0219482 | A1 | 10/2005 | Baselmans et al. | |
| 2005/0219488 | A1 | 10/2005 | Nei et al. | |
| 2005/0219499 | A1 | 10/2005 | Maria Zaal et al. | |
| 2005/0225737 | A1 | 10/2005 | Weissenrieder et al. | |
| 2005/0231694 | A1 | 10/2005 | Kolesnychenko et al. | |
| 2005/0233081 | A1 | 10/2005 | Tokita | |
| 2005/0237501 | A1 | 10/2005 | Furukawa et al. | |
| 2005/0237510 | A1* | 10/2005 | Shibazaki | 355/72 |
| 2005/0052632 | A1 | 11/2005 | Miyajima | |
| 2005/0243292 | A1 | 11/2005 | Baselmans | |
| 2005/0245005 | A1 | 11/2005 | Benson | |
| 2005/0253090 | A1 | 11/2005 | Gau et al. | |
| 2005/0259232 | A1 | 11/2005 | Streefkerk et al. | |
| 2005/0259234 | A1 | 11/2005 | Hirukawa et al. | |
| 2005/0259236 | A1 | 11/2005 | Straaijer | |
| 2005/0269233 | A1 | 11/2005 | Streefkerk et al. | |
| 2005/0263068 | A1 | 12/2005 | Hoogendam et al. | |
| 2005/0264778 | A1 | 12/2005 | Lof et al. | |
| 2005/0270505 | A1 | 12/2005 | Smith | |
| 2006/0061747 | A1* | 3/2006 | Ishii | 355/53 |
| 2006/0082741 | A1 | 4/2006 | Van Der Toorn et al. | |
| 2006/0103820 | A1 | 5/2006 | Donders et al. | |
| 2006/0114445 | A1 | 6/2006 | Ebihara | |
| 2006/0126037 | A1 | 6/2006 | Jansen et al. | |
| 2006/0132733 | A1 | 6/2006 | Modderman | |
| 2007/0127006 | A1 | 6/2007 | Shibazaki | |
| 2007/0211234 | A1 | 9/2007 | Ebihara | |
| 2007/0211235 | A1 | 9/2007 | Shibazaki | |
| 2007/0247607 | A1 | 10/2007 | Shibazaki | |
| 2008/0002163 | A1 | 1/2008 | Fujiwara et al. | |
| 2008/0117393 | A1 | 5/2008 | Fujiwara et al. | |
| 2009/0109413 | A1 | 4/2009 | Shibazaki et al. | |
| 2010/0182584 | A1 | 7/2010 | Shibazaki | |

FOREIGN PATENT DOCUMENTS

| | | | |
|---|---|---|---|
| EP | 1 041 357 | A1 | 10/2000 |
| EP | 1 220 037 | | 7/2002 |
| EP | 1 306 592 | A2 | 5/2003 |
| EP | 1 420 299 | A2 | 5/2004 |
| EP | 1 486 827 | A2 | 12/2004 |
| EP | 1 494 267 | A1 | 1/2005 |
| EP | 1 486 827 | A3 | 3/2005 |
| EP | A 1 635 382 | A1 | 3/2006 |
| JP | A 57-117238 | | 7/1982 |
| JP | A 57-153433 | | 9/1982 |
| JP | A 58-202448 | | 11/1983 |
| JP | A 59-19912 | | 2/1984 |
| JP | A 62-65326 | | 3/1987 |
| JP | A 63-157419 | | 6/1988 |
| JP | A 4-065603 | | 3/1992 |
| JP | A 4-305915 | | 10/1992 |
| JP | A 4-305917 | | 10/1992 |
| JP | A 5-021314 | | 1/1993 |
| JP | A 5-62877 | | 3/1993 |
| JP | A 6-124873 | | 5/1994 |
| JP | A 7-176468 | | 7/1995 |
| JP | A 7-220990 | | 8/1995 |
| JP | A-7-335748 | | 12/1995 |
| JP | A 8-037149 | | 2/1996 |
| JP | A 8-316125 | | 11/1996 |
| JP | A 10-163099 | | 6/1998 |
| JP | A 10-214783 | | 8/1998 |
| JP | A 10-255319 | | 9/1998 |
| JP | A 10-303114 | | 11/1998 |
| JP | A 10-340846 | | 12/1998 |
| JP | A 11-016816 | | 1/1999 |
| JP | A 11-176727 | | 7/1999 |
| JP | A 2000-58436 | | 2/2000 |
| JP | A 2000-505958 | | 5/2000 |
| JP | A 2000-164504 | | 6/2000 |
| JP | A 2000-511704 | | 9/2000 |
| JP | A 2001-160530 | | 6/2001 |
| JP | A 2001-241439 | | 9/2001 |
| JP | A 2001-267239 | | 9/2001 |
| JP | A 2002-014005 | | 1/2002 |
| JP | A 2002-134390 | | 5/2002 |
| JP | A 2002-305140 | | 10/2002 |
| JP | A 2003-17404 | | 1/2003 |
| JP | A 2003-249443 | | 9/2003 |
| JP | A 2004-165666 | | 6/2004 |
| JP | A 2004-207696 | | 7/2004 |
| JP | A 2004-207711 | | 7/2004 |
| JP | A 2004-289128 | | 10/2004 |
| WO | WO 98/40791 | | 9/1998 |
| WO | WO 99/23692 | | 5/1999 |
| WO | WO 99/49504 | | 9/1999 |
| WO | WO 2002/091078 | A1 | 11/2002 |
| WO | WO 2003/077037 | A1 | 9/2003 |
| WO | WO 03/085708 | A1 | 10/2003 |
| WO | WO 2004/019128 | A2 | 3/2004 |
| WO | WO 2004/053953 | A1 | 6/2004 |
| WO | WO 2004/053955 | A1 | 6/2004 |
| WO | WO 2004/114380 | A1 | 6/2004 |
| WO | WO 2004/055803 | A1 | 7/2004 |
| WO | WO 2004/057589 | A1 | 7/2004 |
| WO | WO 2004/057590 | A1 | 7/2004 |
| WO | WO 2004/077154 | A2 | 9/2004 |
| WO | WO 2004/081666 | A1 | 9/2004 |
| WO | WO 2004/090577 | A2 | 10/2004 |
| WO | WO 2004/090633 | A2 | 10/2004 |
| WO | WO 2004/090634 | A2 | 10/2004 |
| WO | WO 2004/092830 | A2 | 10/2004 |
| WO | WO 2004/092833 | A2 | 10/2004 |
| WO | WO 2004/093130 | A2 | 10/2004 |
| WO | WO 2004/093159 | A2 | 10/2004 |
| WO | WO 2004/093160 | A2 | 10/2004 |
| WO | WO 2004/095135 | A2 | 11/2004 |
| WO | WO 2004/105107 | | 12/2004 |
| WO | WO2004/114380 | | 12/2004 |
| WO | WO 2005/001432 | A2 | 1/2005 |
| WO | WO 2005/001572 | A2 | 1/2005 |
| WO | WO 2005/003864 | A2 | 1/2005 |
| WO | WO 2005/006026 | A2 | 1/2005 |
| WO | WO 2005/008339 | A2 | 1/2005 |
| WO | WO 2005/010611 | A2 | 2/2005 |
| WO | WO 2005/013008 | A2 | 2/2005 |
| WO | WO 2005/015283 | A1 | 2/2005 |
| WO | WO 2005/017625 | A2 | 2/2005 |
| WO | WO 2005/019935 | A2 | 3/2005 |
| WO | WO 2005/022266 | A2 | 3/2005 |
| WO | WO 2005/024325 | A2 | 3/2005 |
| WO | WO 2005/024517 | A2 | 3/2005 |
| WO | WO 2005/034174 | A2 | 4/2005 |
| WO | WO 2005/048328 | A1 | 5/2005 |
| WO | WO 2005/050324 | A2 | 6/2005 |
| WO | WO 2005/054953 | A2 | 6/2005 |
| WO | WO 2005/054955 | A2 | 6/2005 |
| WO | WO 2005/059617 | A2 | 6/2005 |
| WO | WO 2005/059618 | A2 | 6/2005 |
| WO | WO 2005/059645 | A2 | 6/2005 |
| WO | WO 2005/059654 | A1 | 6/2005 |
| WO | WO 2005/062128 | A2 | 7/2005 |
| WO | WO 2005/062351 | A1 | 7/2005 |
| WO | WO 2005/064400 | A2 | 7/2005 |
| WO | WO 2005/064405 | A2 | 7/2005 |
| WO | WO 2005/069055 | A2 | 7/2005 |
| WO | WO 2005/069078 | A1 | 7/2005 |
| WO | WO 2005/069081 | A2 | 7/2005 |
| WO | WO 2005/071491 | A2 | 8/2005 |
| WO | WO 2005/074606 | A2 | 8/2005 |
| WO | WO 2005/076084 | A1 | 8/2005 |
| WO | WO 2005/081030 | A1 | 9/2005 |
| WO | WO 2005/081067 | A1 | 9/2005 |
| WO | WO 2005/098504 | A1 | 10/2005 |
| WO | WO 2005/098505 | A1 | 10/2005 |
| WO | WO 2005/098506 | A1 | 10/2005 |
| WO | WO 2005/106589 | A1 | 11/2005 |
| WO | WO 2005/111689 | A2 | 11/2005 |

(56) References Cited

FOREIGN PATENT DOCUMENTS

| | | | |
|---|---|---|---|
| WO | WO 2005/111722 | A2 | 11/2005 |
| WO | WO 2005/119368 | A2 | 12/2005 |
| WO | WO 2005/119369 | A1 | 12/2005 |

OTHER PUBLICATIONS

Preliminary Amendment filed on Jan. 8, 2008 in U.S. Appl. No. 11/812,919 of Shibazaki.
Information Disclosure Statement Letter filed on Jan. 9, 2008 in U.S. Appl. No. 12/007,348 of Fujiwara et al.
Lin, B.J., "Semiconductor Foundry, Lithography, and Partners", Proceedings of SPIE, vol. 4688, pp. 11-24, 2002.
Switkes, M., et al., "Resolution Enhancement of 157nm Lithography by Liquid Immersion", Proceedings of SPIE, vol. 4691, pp. 459-465, 2002.
Switkes, M., et al., "Resolution Enhancement of 157nm Lithography by Liquid Immersion", J. Microlith., Microfab., Microsyst., vol. 1, No. 3, pp. 1-4, 2002.
Owa, Soichi, et al., "Nikon F2 Exposure Tool", slides 1-25, 3rd 157nm Symposium, Sep. 4, 2002.
Owa, Soichi, "Immersion Lithography", slides 1-24, Immersion Lithography Workshop, Dec. 11, 2002.
Owa, Soichi, et al., "Immersion Lithography; its Potential Performance and Issues", Proceedings of SPIE, vol. 5040, pp. 724-733, 2003.
Owa, Soichi, et al., "Potential Performance and Feasibility of Immersion Lithography", slides 1-33, NGL Workshop 2003, Jul. 2003.
Owa, Soichi, et al., "Update on 193nm Immersion Exposure Tool", slides 1-38, Immersion Workshop 2004, Jan. 27, 2004.
Owa, Soichi, et al., "Update on 193nm Immersion Exposure Tool", slides 1-51, Litho Forum, Jan. 28, 2004.
Chinese Office Action dated Aug. 31, 2011 in corresponding Chinese Patent Application No. 201110039515.9.
Office Action dated Sep. 9, 2009 in U.S. Appl. No. 11/812,919.
Office Action dated Apr. 23, 2010 in U.S. Appl. No. 11/812,919.
Office Action dated Mar. 1, 2011 in U.S. Appl. No. 11/812,919.
Office Action dated Sep. 1, 2011 in U.S. Appl. No. 11/812,919.
Office Action dated Dec. 3, 2008 in U.S. Appl. No. 11/785,716.
Office Action dated Nov. 10, 2011 in U.S. Appl. No. 12/007,348.
Office Action dated Apr. 14, 2011 in U.S. Appl. No. 12/007,348.
Office Action dated Aug. 20, 2010 in U.S. Appl. No. 12/007,348.
Office Action dated Nov. 18, 2009 in U.S. Appl. No. 12/007,348.
Office Action dated Jan. 6, 2009 in U.S. Appl. No. 12/007,348.
Chinese Office Action dated Jun. 14, 2012 in corresponding Chinese Patent Application No. 201110039515.9.

* cited by examiner

DUAL STAGE LITHOGRAPHIC APPARATUS AND DEVICE MANUFACTURING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*More than one reissue application has been filed for the reissue of U.S. Pat. No. 7,161,659. The reissue applications are continuation reissue application Ser. No. 14/715,314 (the present application), continuation reissue application Ser. No. 13/970,429 now allowed, continuation reissue application Ser. No. 13/584,522, now Reissue Pat. No. RE44,446, and parent reissue application Ser. No. 12/318,821, now Reissue Pat. No. RE43,576, all of which are reissue applications of U.S. Pat. No. 7,161,659.*

RELATED APPLICATION

The present application *is a continuation reissue patent application of reissue patent application No. 13/970,429, filed Aug. 19, 2013 (now allowed), which is a continuation reissue patent application of reissue patent application Ser. No. 13/584,522, filed Aug. 13, 2012 (now U.S. Pat. No. RE44,446), which is incorporated herein in its entirety by reference, which is a continuation reissue patent application of reissue patent application Ser. No. 12/318,821, filed Jan. 8, 2009 (now U.S. Pat. No. RE43,576), which is incorporated herein in its entirety by reference, which is a reissue application of U.S. patent application Ser. No. 11/135,655, filed May 24, 2005 (now U.S. Pat. No. 7,161,659), which* is a Continuation In Part Application of U.S. application Ser. No. 11/101,631, filed on Apr. 8, 2005 now abandoned.

FIELD

The present invention relates to a multi stage lithographic apparatus and a method for manufacturing a device with the multi stage lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

There is an ongoing development in improving current lithographic apparatus. An aspect herewith is to increase the throughput (throughput is related to the number of substrates that can be processed in a certain time by a lithographic apparatus). For example, Dual Stage Lithographic apparatus generally have a larger throughput than Single stage apparatus since a substrate on a first substrate stage may be measured in a metrology station while another substrate on a second substrate stage is exposed in an exposure station on the basis of data measured previously in the metrology station. Another aspect is to improve the capability of lithographic apparatus to transfer patterns with smaller structures (but with a given quality) on substrates. For example, an Immersion lithographic apparatus is capable of transferring patterns with smaller structures in comparison with non-immersion lithographic apparatus (see for example EP 1486827, incorporated herein by reference).

In U.S. Pat. No. 5,969,441 (incorporated herein by reference) a Dual Stage lithographic apparatus is described that is provided with "H-drives" (see for example FIGS. 4, 5: respective X-actuators 105 and 107 connected to respective sets of opposite Y-actuators 109, 111 and 113, 115) for its substrate stages (substrate holders 11, 13). The described Dual Stage yields a relatively high throughput but a disadvantage is that the substrate stages need a "stage-swap" (according to the transition between FIG. 4 and FIG. 5 wherein substrate holder 11 is uncoupled from unit 25 and coupled to unit 27 and wherein substrate holder 13 is uncoupled from unit 27 and coupled to unit 25) for passing each other while moving between the metrology station and the exposure station (column 16, lines 47-52). The apparatus has the disadvantage that the stage-swap takes time, thus yielding a decreased throughput.

In U.S. Pat. No. 6,341,007 (incorporated herein by reference) (see in particular FIGS. 2, 3, 4) a Dual Stage lithographic apparatus is described that is provided with one exposure station situated between two metrology stations. The substrates in the batch are measured alternately in the metrology stations before exposure in the exposure station. The stages can not pass each other while moving between the metrology stations and the exposure station (see FIG. 3). A disadvantage of this lithographic apparatus is that it requires two metrology stations. Therefore, there is a necessity of providing a double substrate conveying path. The extra metrology station and the extra conveying path yield an expensive lithographic apparatus. Furthermore, the system layout takes relatively much (floor)-space in the facrories (large footprint). A further disadvantage is that this concept yields problems of a logistics nature. Furthermore, the lithographic apparatus is not suitable for immersion lithographic applications such that it is not capable to project relatively small structures on the substrates.

SUMMARY

It is desirable to at least partially alleviate one of the mentioned disadvantages. In particular it is an aspect of the invention to provide a lithographic apparatus with a relatively high throughput and the capability of transferring patterns with relatively small structures on substrates.

In order to meet the desire the invention proposes a lithographic apparatus comprising:

a support constructed to support a patterning device, the patterning device being capable of imparting a radiation beam with a pattern in its cross-section to form a patterned radiation beam;

a measuring system for measuring characteristics of substrates in a metrology station of the apparatus;

a projection system configured to project the patterned radiation beam onto a substrate in an exposure station of the apparatus;

a liquid confinement system for confining liquid between a final element of the projection system and the substrate;

a positioning system and at least two substrate stages constructed to hold substrates, wherein the positioning system is constructed for moving the stages between the metrology station and the exposure station, and wherein the positioning system is constructed for positioning one of the stages holding a substrate during exposure in the exposure station on the basis of at least one measured characteristic of that substrate;

wherein the stages are constructed and arranged for mutual cooperation in order to perform a joint scan movement for bringing the lithographic apparatus from a first situation, wherein the said liquid is confined between a first substrate held by the first stage of the said stages and the final element, towards a second situation, wherein the said liquid is confined between a second substrate held by the second stage of the two stages and the final element, such that during the joint scan movement the liquid is essentially confined within said space with respect to the final element. The joint scan movement yields an increased throughput compared to conventional immersion lithographic apparatus wherein a separate closing disc is used for confining the liquid between the transfer from the said first situation and the said second situation.

In order to meet the desire the invention proposes a lithographic apparatus comprising:

a support constructed to support a patterning device, the patterning device being capable of imparting a radiation beam with a pattern in its cross-section to form a patterned radiation beam;

a measuring system for measuring characteristics of substrates in a metrology station of the apparatus;

a projection system configured to project the patterned radiation beam onto a substrate in an exposure station of the apparatus;

a positioning system for positioning at least two substrate stages of the lithographic apparatus, wherein the stages are constructed to hold substrates;

a machine frame which is provided with a first part of a planar motor for cooperating with respective second parts of the planar motor in the respective stages, wherein the positioning system is constructed and arranged to control the planar motor for moving the stages between the metrology station and the exposure station and for moving each of the said stages in the exposure station in six degrees of freedom on the basis of at least one measured characteristic of the substrate on the stage, wherein the machine frame is constructed and arranged to allow the stages to pass each other while moving between the metrology station and the exposure station. Since the stages can pass each other there is no need for a "stage-swap". In this way an apparatus is provided with a relatively high throughput while having only one metrology station and only one exposure station, and wherein the apparatus has a relatively small "footprint".

In order to meet the desire the invention proposes a lithographic apparatus comprising:

a support constructed to support a patterning device, the patterning device being capable of imparting a radiation beam with a pattern in its cross-section to form a patterned radiation beam;

a measuring system for measuring characteristics of substrates in a metrology station of the apparatus;

a projection system configured to project the patterned radiation beam onto a substrate in an exposure station of the apparatus;

a positioning system and at least two stages constructed to hold substrates, wherein the positioning system is constructed for moving the stages between the metrology station and the exposure station, and wherein the positioning system is constructed for positioning one of the stages holding a substrate during exposure in the exposure station on the basis of at least one measured characteristic of that substrate, a machine frame having two essentially parallel guides extending in a first direction in a horizontal plane, wherein each guide is coupled to an element which can be moved along the guide by means of a motor, and wherein each element is coupled to a stage by means of a motor for moving the stage in a second direction directed in the horizontal plane and perpendicular to the first direction, wherein the positioning system is constructed and arranged for controlling the motors in order to move the stages in the plane, wherein the machine frame is constructed and arranged to allow the stages to pass each other while moving between the metrology station and the exposure station. Since the stages can pass each other there is no need for a "stage-swap". In this way an apparatus is provided with a relatively high throughput while having only one metrology station and only one exposure station, and wherein the apparatus has a relatively small "footprint".

In order to meet the desire the invention proposes a lithographic apparatus comprising:

a support constructed to support a patterning device, the patterning device being capable of imparting a radiation beam with a pattern in its cross-section to form a patterned radiation beam;

a measuring system for measuring characteristics of substrates in a metrology station of the apparatus;

a projection system configured to project the patterned radiation beam onto a substrate in an exposure station of the apparatus;

a positioning system and at least two stages constructed to hold substrates, wherein the positioning system is constructed for moving the stages between the metrology station and the exposure station, and wherein the positioning system is constructed for positioning one of the stages holding a substrate during exposure in the exposure station on the basis of at least one measured characteristic of that substrate;

a base frame carrying a metro frame which supports the measuring system and the projection system, wherein the metro frame is dynamically isolated from the base frame, and wherein the measuring system comprises an encoder system extending in both the metrology station and the exposure station for measuring the position of the stages. The said encoder system for example reduces the need of frequent TIS alignments (aligning masks/reticles on the one hand with substrates on the other hand via Transmission Image Sensors such as described in EP 1510870, incorporated herein by reference, see in particular FIGS. 8A, 8B). The reduction of the necessity of frequent TIS-alignments increases throughput of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
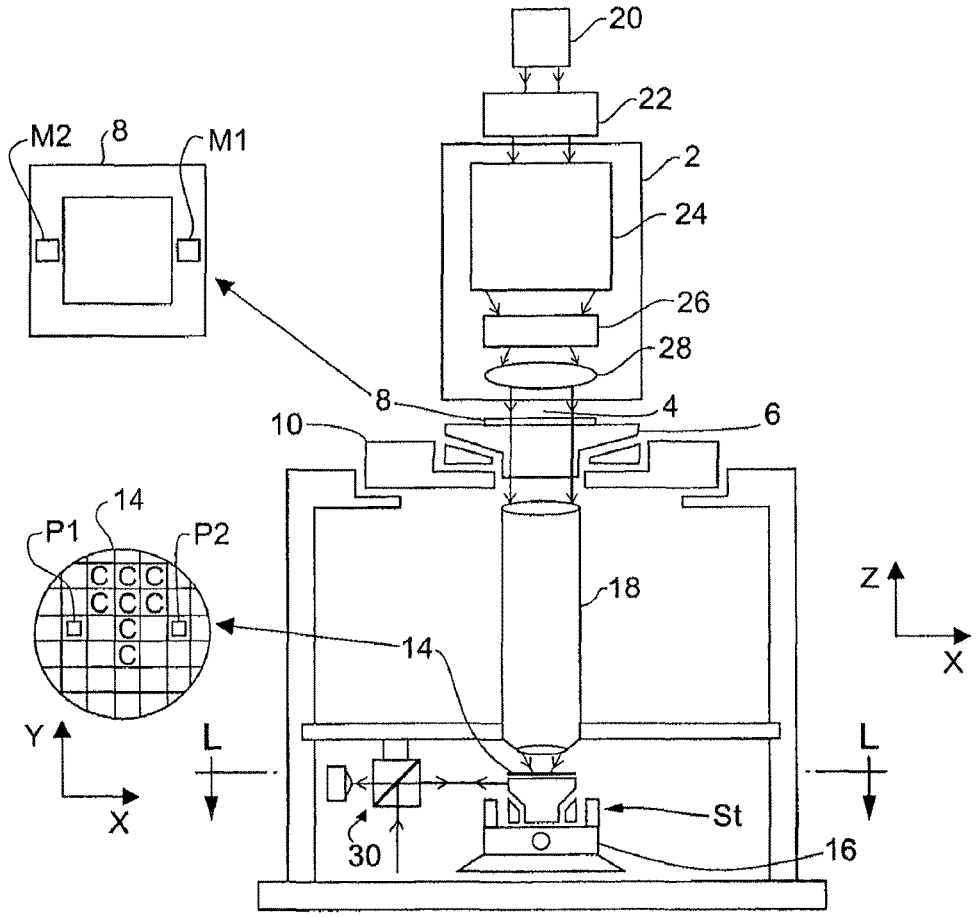
FIG. 1A schematically depicts a lithographic apparatus according to an embodiment of the invention in a side-view.

FIG. 1A schematically depicts a lithographic apparatus according to one embodiment of the invention. The apparatus comprises:

an illumination system (illuminator) 2 configured to condition a radiation beam 4 (e.g. UV radiation).

a support structure (e.g. a mask table) 6 constructed to support a patterning device (e.g. a mask) 8 and coupled to a first positioner 10 configured to accurately position the patterning device in accordance with certain parameters;

a substrate table (e.g. a wafer table) WT constructed to hold a substrate (e.g. a resist-coated wafer) 14 and coupled (via a mirror block MB) to a second positioner 16 configured to accurately position the substrate in accordance with certain parameters; and a projection system (e.g. a refractive projection lens system) 18 configured to project a pattern imparted to the radiation beam 4 by patterning device 8 onto a target portion C (e.g. comprising one or more dies) of the substrate 14.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any typo of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only moans that liquid is located between the projection system and the substrate during exposure.

Referring to FIG. 1A, the illuminator 2 receives a radiation beam from a radiation source 20. The source and the lithographic apparatus may be separate entities, for example when the source is an excimer laser. In such cases, the source is not considered to form part of the lithographic apparatus and the radiation beam is passed from the source 20 to the illuminator 2 with the aid of a beam delivery system 22 comprising, for example, suitable directing mirrors and/or a beam expander. In other cases the source may be an integral part of the lithographic apparatus, for example when the source is a mercury lamp. The source 20 and the illuminator 2, together with the beam delivery system 22 if required, may be referred to as a radiation system.

The illuminator 2 may comprise an adjuster 24 for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator 2 may comprise various other components, such as an integrator 26 and a condenser 28. The illuminator may be used to condition the radiation beam, to have a desired uniformity and intensity distribution in its cross-section.

The radiation beam 4 is incident on the patterning device (e.g., mask 8), which is held on the support structure (e.g., mask table 6), and is patterned by the patterning device. Having traversed the mask 8, the radiation beam 4 passes through the projection system 18, which focuses the beam onto a target portion C of the substrate 14. With the aid of the second positioner 16 and position sensor 30 (e.g. an interferometric device, linear encoder or capacitive sensor), the substrate table WT of a wafer stage St can be moved accurately, e.g. so as to position different target portions C in the path of the radiation beam 4. For this, known measure & Control algorithms with feedback and/or feedforward loops may be used. Similarly, the first positioner 10 and another position sensor (which is not explicitly depicted in FIG. 1A) can be used to accurately position the mask 8 with respect to the path of the radiation beam 4, e.g. after mechanical retrieval from a mask library, or during a scan. In general, movement of the mask table 6 may be realized with the aid of a long-stroke module (coarse positioning) and a short-stroke module (fine positioning), which form part of the first positioner 10. Similarly, movement of the substrate table WT may be realized using a long-stroke module and a short-stroke module, which form part of the second positioner 16. In the case of a stepper (as opposed to a scanner) the mask table 6 may be connected to a short-stroke actuator only, or may be fixed. Mask 8 and substrate 14 may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask 8, the mask alignment marks may be located between the dies.

Figure 1B:
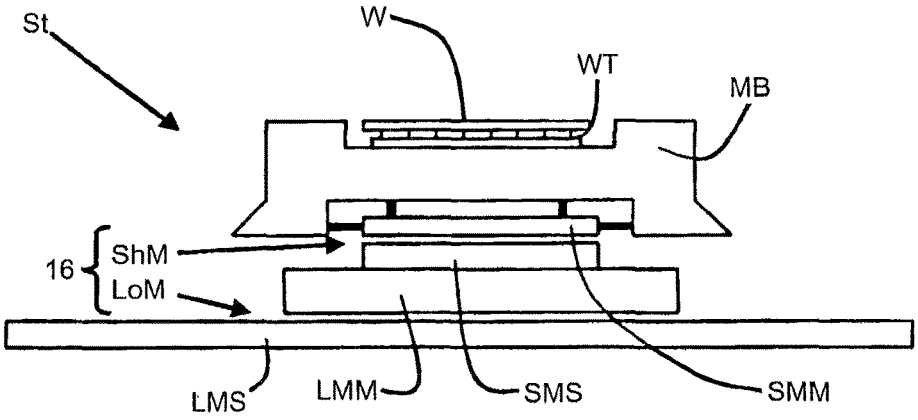
FIG. 1B shows a stage of the lithographic apparatus according to FIG. 1A.

FIG. 1B shows a substrate stage St (also called substrate chuck) for the lithographic apparatus according to FIG. 1A. The stage St comprises the non-stationary parts of the second positioner 16, a mirror block MB, and the substrate table WT mounted to the mirror block MB. In this example the mirror block MB is provided with interferometer-mirrors which are arranged for cooperation with interferometers for measuring the position of the mirror block MB.

The second positioner 16 is arranged for positioning the mirror block MB and the substrate table WT. The second positioner 16 comprises the short stroke module (which is provided with a short stroke motor ShM) and the long stroke module (which is provided with a long stroke motor LoM).

The long stroke motor LoM comprises a stationary part LMS that can be mounted to a stationary frame or a balance mass (not shown) and a non-stationary part LMM that is displaceable relative to the stationary part. The short stroke motor ShM comprises a first non-stationary part SMS (that may be mounted to the non-stationary part LMM of the long stroke motor) and a second non-stationary part SMM (that may be mounted to the mirror block MB).

It should be noted that the mask table 6 and the first positioner 10 (see FIG. 1A) may have a similar structure as depicted in FIG. 1B.

A so-called dual stage (multi stage) machine may be equipped with two (or more) stages as described. Each stage can be provided with an object table (such as the substrate table WT). In such an arrangement, a preparatory step such as the measurement of a height map of the substrate disposed on one of the object tables can be performed in parallel with the exposure of the substrate disposed on another object table. In order to expose a substrate that previously has been measured, the stages may change position from the measurement location to the exposure location (and vice versa). As an alternative, the object tables can be moved from one stage to an other.

The apparatus depicted in FIG. 1A could be used in at least one of the following modes:

1. In step mode, the mask table 6 and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table 6 and the substrate table WT are scanned synchronously while a pattern imparted to the radiation beam is projected onto a target portion C (i.e. a single dynamic exposure). The velocity and direction of the substrate table WT relative to the mask table 6 may be determined by the (de-)magnification and image reversal characteristics of the projection system 18. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table 6 is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
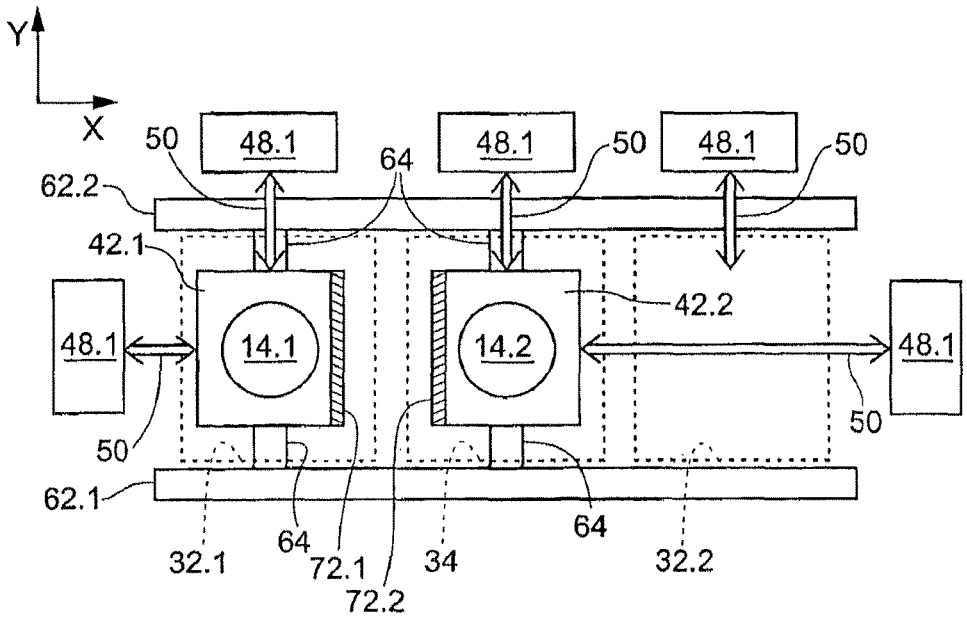
FIG. 4 is a schematic top-view of a first embodiment of the drive and stage configuration of the dual stage immersion lithography apparatus according to FIG. 1A.
Figure 5:
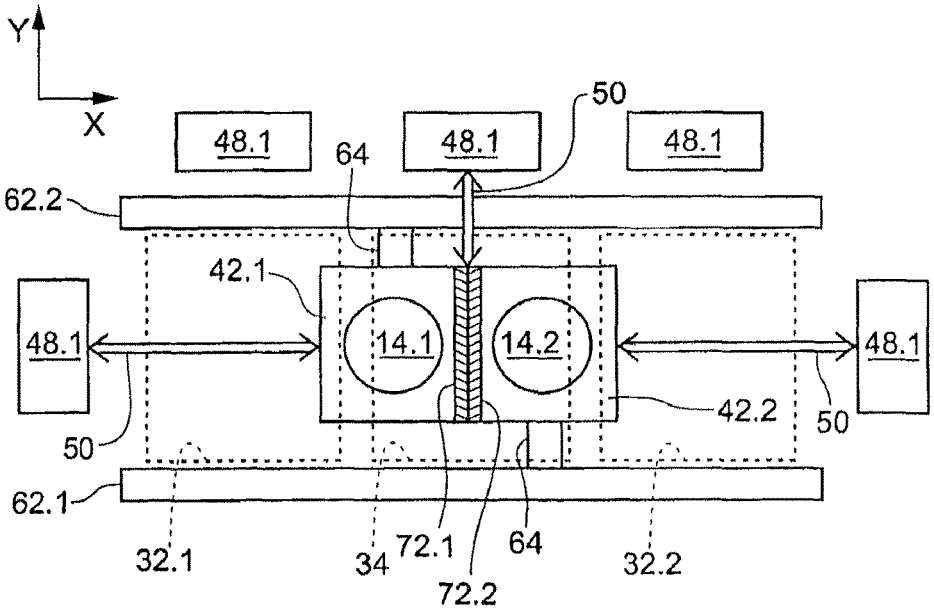
FIG. 5 is a schematic top-view of the apparatus of FIG. 4 showing a joint scan movement.

FIG. 4 is a schematic top-view of an embodiment of a drive and stage configuration of the lithographic apparatus schematically shown in FIG. 1A. The part is defined by a plane indicated in FIG. 1A by the line LL. The lithographic apparatus comprises a first metrology station 32.1, a second metrology section 32.2 and an exposure station 34 which is situated between the metrology stations 32.1, 32.2.

Figure 2:
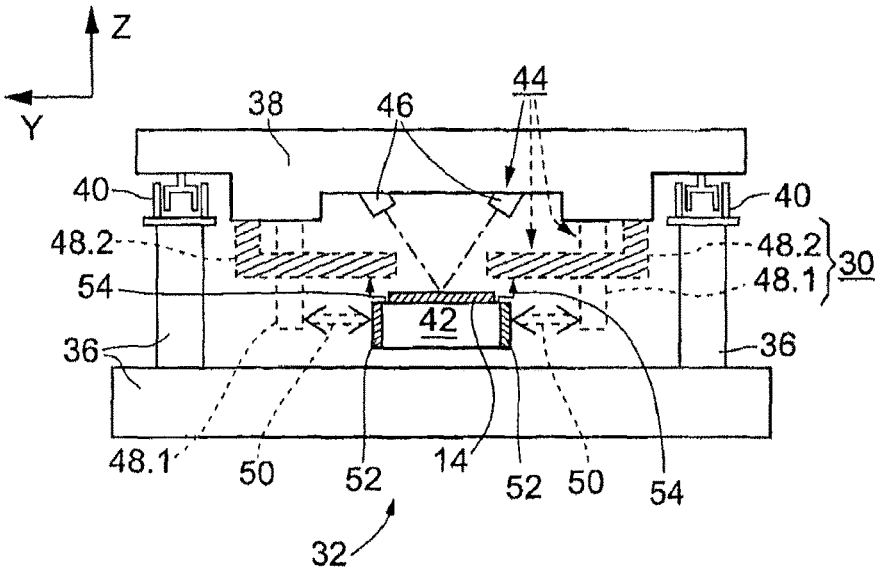
FIG. 2 is a schematic side-view of a metrology station of the lithographic apparatus according to the invention.

In FIG. 2 a schematic side view of a metrology station 32 is provided. The metrology station is supported by a base frame 36 which carries a metro frame 38. The base frame 36 may be placed directly on the floor in a factory. The base frame 36 and the metro frame 38 are dynamically isolated by isolation means 40 (the isolation means 40 may be passive isolation means such as airmounts, active isolation means such a pneumatic pistons or combinations thereof). Due to the dynamical isolation, it is prevented that vibrations or other disturbance movements in the base frame transfer into the metro frame (the disturbances will at least be reduced to a relatively large amount). The metro frame and elements which are connected to it are sometimes called the "silent world".

FIG. 2 also shows a (substrate) stage 42 holding a substrate 14 and a measuring system 44 comprising a height measurement sensor 46 and a position sensor 30. In this example, the position sensor 30 is capable of measuring the position of the stage 42 in six degrees of freedom. The measuring system 44 is carried by the metro frame and is therefore part of the silent world. The sensors 46, 30 may be used for measuring a characteristic (height map) of the substrate 14 held by the stage 42. The height map is used later during exposure in the exposure station 34.

The position sensor 30 for measuring the position of the stage 42 may be an interferometer sensor 48.1 which is capable of directing interferometer measurement beams 50 towards interferometer mirrors 52 attached to the stage 42. As an alternative, the position sensor may be an encoder system 48.2 for measuring the position of the stage 42. However, it is noted here that combinations of interferometers and encoders, whereby the interferometer system measures different parameters than the encoder are also possible.

In the presented example of FIG. 2 the encoder system 48.2 is an encoder plate which is attached to the metro frame 38. The stage 42 is provided with encoder heads 54 which are capable of cooperating with the encoder plate 48.2 for measuring the position of the stage 42. Note that the encoder plate is provided with a cut-away to let the height measurement sensor 46 directing a light measurement beam through the cut-away on the surface of the substrate 8 for measuring the height of the surface of the substrate. Preferably, each corner (at or near each corner) of the upper surface of the stage 42 is provided with an encoder head 54. The position of the stage can be measured at any location under the cut-away with the encoder system 48.2.

Figure 3:
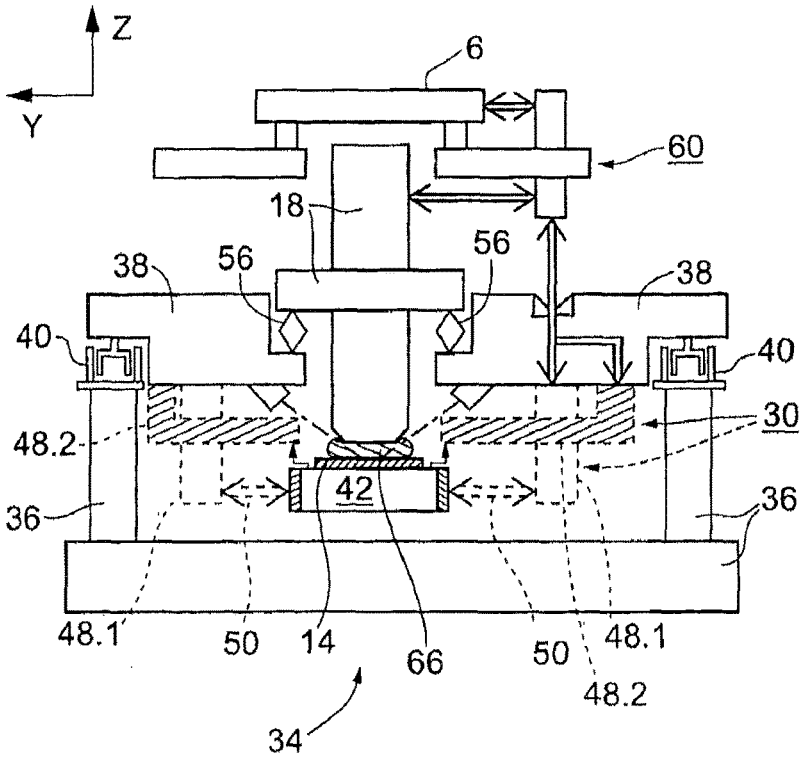
FIG. 3 is a schematic side-view of an exposure station of the lithographic apparatus according to the invention.

FIG. 3 is a schematic side view of an exposure station 34. The exposure station 34 is supported by the base frame 36. The base frame carries the metro frame 38, the metro frame 38 is dynamically isolated from the base frame 36 by the isolation means 40. The projection system 18 is supported by the metro frame 38 via supporting members 56 (the supporting members 56 may also be dynamical isolation means). In this example the metro frame 38 carries the position sensor 30 (an interferometer 48.1 and/or an encoder system 48.2, whereby it is noted that the encoder system 48.2 is provided with a cut away for the projection system 18). However, it is noted that the position sensor 30 may also be carried by the projection system 18 (or, equivalently, by a frame attached to the projection system 18).

If the position sensor 30 is an encoder plate 48.2, then this encoder plate may extend both in the exposure station 34 and the metrology station 32. In an advanced embodiment there is only one encoder plate which extends completely from the metrology station 32 to the exposure station 34.

A reticle stage or mask stage 6 is located above the projection system 18. The position of the reticle stage and the position of the mask/reticle are measured by a measuring system 60. The measuring system 60 cooperates with the position sensor 30 in order to align the mask/reticle with the substrate 14 under the projection system 18. Aligning the mask/reticle to the substrate is usually performed according to zero point sensors and TIS-alignment techniques (see for a description EP 1510870). For applying the TIS-alignment it is required that the position of the substrate with respect to the base frame 36 is known within a certain accuracy (rough indication as starting point for the fine TIS measurements) such that the substrate is in the capture range of the TIS sensor.

Generally, interferometer sensors measure relative positions (by counting fringes). In order to obtain absolute position measurements via the interferometer sensor the interferometer sensors can be "zerod" by means of a so-called zeroing-operation, which means that a reference point is defined in order to obtain absolute position measurements. Defining such a reference point is of special interest in a multi-stage apparatus, since in such an apparatus it frequently occurs that one stage eclipses another stage yielding a loss of an already defined reference point. If this happens it may be necessary to define a new reference point (according to a new zeroing operation) has to be defined which costs time and reduces throughput. However, the application of the encoder plate may yield an absolute measurement system which reduces or even eliminates the necessary zeroing operations which is beneficial for throughput. Furthermore, if the encoder plate has a high accuracy, the frequency of TIS-alignments itself may also be reduced or even eliminated (at least partly replaced by the encoder measurements), such that the throughput of the corresponding apparatus is further increased.

As shown in FIG. 4, the stages holding substrates can be exchanged between, on the one hand, the metrology stations 32.1, 32.2 and, on the other hand, the exposure station 34. This will be described in more detail hereinafter. FIG. 4 schematically depicts two guides 62.1, 62.2 which extend in a first direction (the X-direction) in a horizontal plane. The guides 62 may be attached to the base frame 36, but it is preferred to attach the guides 62 to a machine frame which is completely separated (thus no dynamical coupling) from the said base frame 36, the metro frame 38 and the projection lens 18.

Each guide 62 is coupled to elements 64 which can be moved along the guide 62 in the first direction (X-direction) by means of a motor of the positioning system. In the configuration of FIG. 4 each stage 42.1, 42.2 is coupled to two elements 64. Each stage can be moved in the horizontal plane in the Y-direction (which is essentially perpendicular to the first direction) by motors in the elements 64. In a preferred embodiment the motors in the guides 62 and/or in the elements 64 cooperate with balance masses in order to reduce effects of reaction forces. The stages 42.1, 42.2 may be supported by the base frame 36 via an air bearing which yields a dynamical isolation of the base frame 26 and the stages 42.1, 42.2. It is noted that as an alternative of the described drive configuration a planar motor configuration may be applied.

In the configuration of FIG. 4 the stages can not pass each other. Therefore, the working sequence of the lithographic apparatus which belongs to this configuration is as follows. A substrate 14.1 is provided on the first stage 42.1 via a first substrate convey path to the first metrology station 32.1. Then this substrate is measured (see FIG. 2, measurement system 44, generation of a height map) in the metrology station 32.1 while being scanned in the horizontal plane (the stage 42.1 is moved in the horizontal plane for this). The position of the stages 42.1, 42.2 is, in the example of FIG. 4, measured by an interferometer system 48.1. Next the stage is transferred to the exposure station 34 in order to expose the substrate 14.1 held by the stage 42.1. The exposure is based on the measured height map of the substrate 14.1, wherein the stage 42.1 holding the substrate is positioned by the positioning system. (It is noted that the said motors are capable of positioning the stage in six degrees of freedom, however within a limited range, under the projection system 18). At the same time, the other stage 42.2 is in the second metrology station 32.2 and holds a substrate 14.2 which is measured. The substrate 14.2 has been supplied via a second substrate convey path. After the exposure of substrate 14.1 has been performed the stage 42.1 with the exposed substrate moves to the first metrology station 32.1, the exposed substrate 14.1 is conveyed via the first substrate convey path, and a new substrate to be measured is loaded on the stage 42.1 via the first substrate convey path. At the same time the substrate 14.2 held by the stage 42.2 is exposed. The sequence continues in this way. It is clear that the configuration requires a double substrate convey path.

It is noted that the beams of the interferometers sometimes have to bridge relatively great distances between the interferometer system and the interferometer-mirror attached to the stage (see FIG. 4, interferometer beams in the X-direction). This decreases the accuracy of the measurement in this direction, since pressure variations in the air disturb the interferometer measurement beam (this effect increases with an increased distance). Application of the discussed encoder system 48.2 alleviates this disadvantage and may yield higher measurement accuracies.

Figure 6:
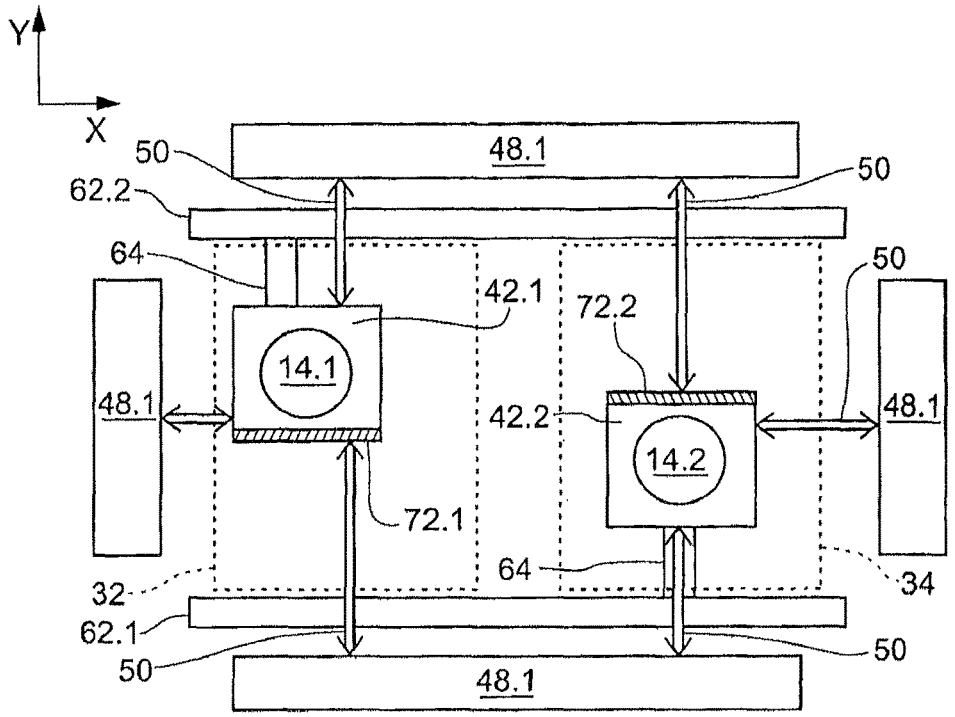
FIG. 6 is a schematic top-view of a second embodiment as of the drive and stage configuration of the dual stage immersion lithography apparatus according to FIG. 1A.
Figure 7:
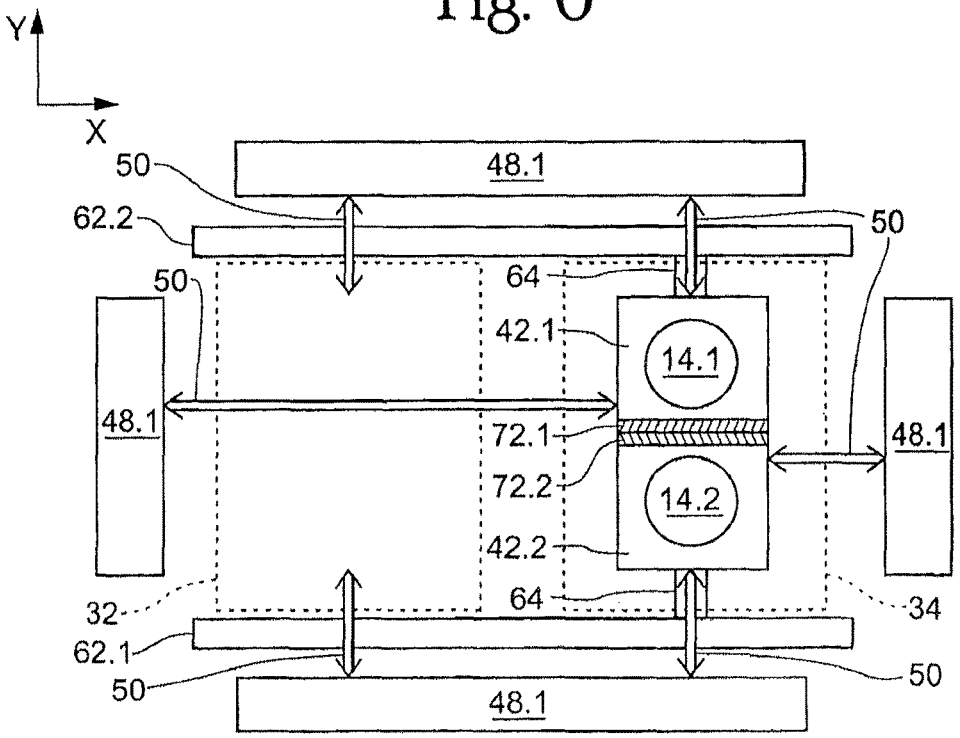
FIG. 7 is a schematic top-view of the apparatus of FIG. 6 showing a joint scan movement.

FIG. 6 schematically depicts another dual stage concept in a top-view defined by the line LL in FIG. 1. In this concept stages with substrates 42.1, 42.2 can be exchanged between the metrology station 32 and the exposure station 34. The concept is provided with two guides 62.1, 62.2 which extend in a first direction (the X-direction) in a horizontal plane. The guides 62 may be attached to the base frame 36, but it is preferred to attach the guides 62 to a machine frame which is completely separated (thus no dynamical coupling) from the said base frame 36, the metro frame 38 and the projection lens 18. Each guide 62 carries an element 64 which can be moved along the guide 62 in the first direction (X-direction) by means of a motor (part of and) controlled by the positioning system. In this example the elements 64 are T-elements which are part of a so-called "T-drive". Each stage 42.1, 42.2 is coupled to one T-element 64, wherein the T-element 64 can move the stage to which it is coupled in the Y-direction by a motor which may be present in the element 64. The motor is (preferably part of and) controlled by the positioning system. In a preferred embodiment the motors in the guides 62 and/or in the elements 64 cooperate with balance masses in order to reduce effects of reaction forces. It is noted that the stages 42.1, 42.2 may be supported by the base frame 36 via a dynamically isolating air bearing.

The dual stage concept according to FIG. 6 allows the stages 42.1 and 42.2 to pass each other while being moved between the metrology station 32 and the exposure station 34. This concept based on the T-drives does not require a stage swap (in contrast to the H-drive concept described in U.S. Pat. No. 5,969,441). Therefore a relatively high throughput can be achieved since a continuous transfer movement of the stages is possible without a stop for a swap.

As an alternative of the depicted "T-drive system" (guides 62.1, 62.2 and T-elements 64 in FIG. 6) a planar motor configuration can be used. According to the planar motor configuration the lithographic apparatus is provided with a machine frame with coils and/or magnets (the first part of the planar motor) for cooperating with magnets and/or coils in the said stages 42.1, 42.2 (the respective second parts of the planar motor) such that the positioning system can move each of the said stages 42.1, 42.2 between the metrology station 32 and the exposure station 34. Such a planar motor can also be used to position the stages in the exposure station 34 in six degrees of freedom. The machine frame may be part of the base frame 36 (then the coils and/or magnets) are integrated in the base frame 36, or the machine frame is separated (dynamically isolated) from the base frame 36. The planar motor is under control of the positioning system.

According to an embodiment of the lithographic apparatus according to the invention there is provided an immersion liquid 66 between a final optical (lens) element of the projection system 18 and a target portion of the substrate 14 (FIG. 3). The application of immersion fluid yields the advantage that during exposure smaller structures of patterns can be transferred from the reticle or mask to substrates 14 than in a comparable system without immersion fluid. The lithographic apparatus has a liquid confinement system for confining liquid between a final element of the projection system and the substrate. The liquid confinement system comprises a so-called immersion hood 68 (see FIG. 9). The immersion fluid may be kept in place during illumination by the immersion hood 68. The immersion hood 68 may comprise a mechanical contact-seal and/or may also comprise a contact-less seal which operation is based on guiding a pressure-gas-flow towards the fluid to be confined (combinations are possible).

After exposure of a substrate the stage holding it has to move away, for example towards a metrology station. Since it is desired that the immersion fluid 66 is kept in its space under the final element of the projection system 18, special measures have to be taken before the stage can be moved away from its position under the space of the immersion liquid 66. A possibility is to use a separate closing disc or a separate small closing stage (unable to hold a substrate) which closes the space at the bottom, until a stage holding a substrate to be exposed takes the place of the closing disc/closing stage.

However, the said closing disc/closing stage yields extra take-over operations which cost valuable time and which appear to decrease the throughput of the lithographic apparatus significantly.

Therefore, it is an aspect of the invention to prevent the necessity of a closing disc (or closing stage) and to provide a lithographic apparatus wherein the stages are constructed and arranged for mutual cooperation in order to perform a joint scan movement for bringing the lithographic apparatus from a first situation, wherein the said liquid is confined between a first substrate held by the first stage of the said stages and the final element, towards a second situation, wherein the said liquid is confined between a second substrate held by the second stage of the two stages and the final element, such that during the joint scan movement the liquid is essentially confined within said space with respect to the final element.

Figure 9:
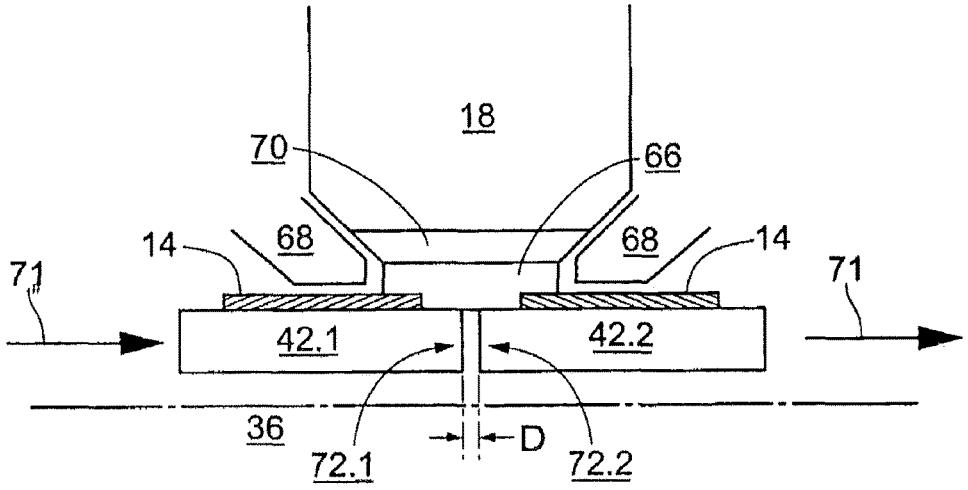
FIG. 9 is a schematic side-view showing two substrate stages in a vertical cross section, wherein the stages perform a joint scan movement.

The said joint scan movement of the stages 42.1 and 42.2 is illustrated schematically in FIG. 9 (the arrows 71 indicate the direction of movement of the stages with respect to the projection system 18). The joint scan movement is performed such that the liquid 66 stays confined in its space under the final lens element 70. At the bottom of the space the stages 42.1, 42.2 confine the liquid 66. At the sides it is the immersion hood (which preferably stays in an essentially fixed position with respect to the projection system 18) which confines the liquid 66.

In an advanced embodiment the respective first stage 42.1 and second stage 42.2 have respective immersion cross edges 72.1, 72.2 (situated at or near a side of the relevant stage, see FIG. 9), wherein the immersion cross edges are constructed and arranged to cooperate with each other during the joint scan movement. Preferably each immersion cross edge 72 comprises one or more essentially plane and smooth surface(s). Thus, it is possible to perform the said joint scan movement in such a way that a well-defined space is obtained between plane surfaces of different immersion cross edges (for example a space defined by parallel surfaces). In FIG. 9 an example is provided wherein the cooperating immersion cross edges of the stages define a space with a mutual distance D during the joint scan movement.

Figure 10:
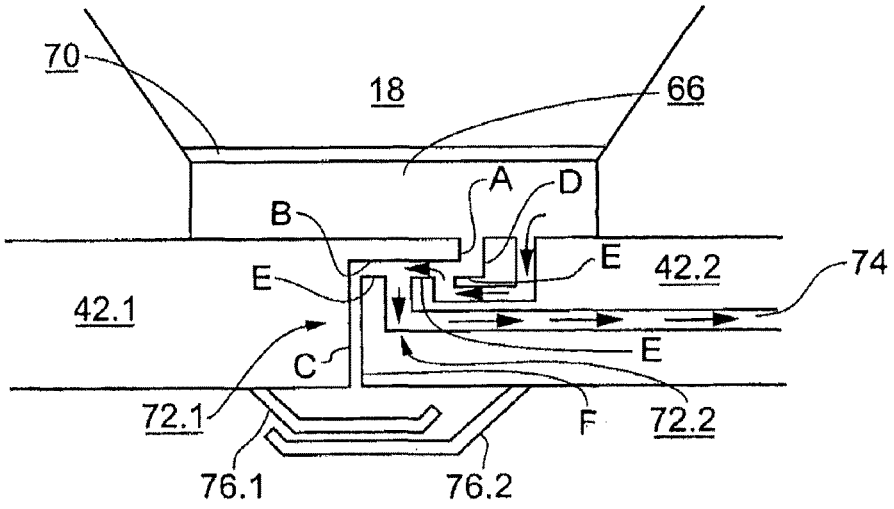
FIG. 10 is a schematic vertical cross section of a first embodiment of the stages in FIG. 9.

A different shape of the immersion cross edges 72.1, 72.2 is shown in FIG. 10. In FIG. 10 the stage 42.1 shows an immersion cross edge with respectively a vertical plane A, a horizontal plane B and a vertical plane C. These planes are constructed to cooperate with respective planes D, E, F of the immersion cross edge 72.2.

The lithographic apparatus according to the invention may comprise a control system (using a feedback and/or a feedforward loop) that may be fed with position measurements (actually the term position measurement may include position, velocity, acceleration and/or jerk measurements) of the stages (the measurements may be performed by the measurement system 44) for calculating setpoint-signals for the relevant motors. The motors are controlled during the joint scan movement of the stages by the positioning system according to the setpoint-signals such that the mutual constant distance D between the planes of the respective immersion cross edges corresponds to a pre-determined function. The pre-determined function may be chosen such that the space between the immersion cross edges functions a liquid channel character (see below for further description).

According to an embodiment of the lithographic apparatus, the positioning system is constructed and arranged to control the motors for moving the stages such that stage 42.1 pushes the stage 42.2 gently during the joint scan movement. Herewith, a control system (using a feedback and/or a feedforward loop) of the positioning system is fed with position measurements (actually the term position measurement may include position, velocity, acceleration and/or jerk measurements) of the stages (performed by the measurement system 44) and calculates setpoint-signals for the relevant motors. Next, motors are controlled by the positioning system according to the setpoint-signals such that the mutual constant distance D between the planes of the respective immersion cross edges is essentially zero.

According to a preferred embodiment of the lithographic apparatus, the positioning system is constructed and arranged to control the motors for moving the stages such that during the joint scan movement the said mutual distance D is larger than zero but smaller that 1 millimeter. A favorable mutual distance D appears to be between 0.05 and 0.2 millimeter. A distance D in this distance-range is especially favorable if one of the stages is provided with a channel system 74 leading to and from an opening the immersion cross edge, wherein the channel system 74 is constructed and arranged for generating a flow of gas and/or liquid along the immersion cross edge during the joint scan movement. The generation of this flow is of importance to reduce the chance that bubbles (bubbles deteriorate the projection of patterns on the substrate) are generated in the immersion liquid 66. A stable and well controlled distance D results in a stable and well favorable flow thereby avoiding the generation of bubbles in the immersion liquid during the joint scan movement.

Figure 11:
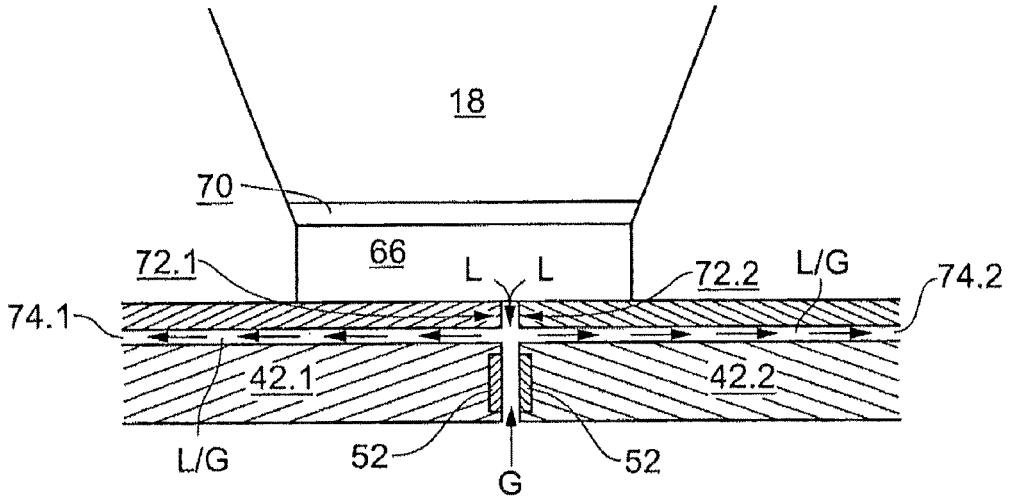
FIG. 11 is a schematic vertical cross section of a second embodiment of the stages in FIG. 9.

The application of a channel system 74 may yield (during the joint scan movement) a gas flow from under the stages 42 (see for example FIG. 11 with indication G) and a liquid flow from above the stages (see for example FIG. 11 with indication L). Then a mixture of gas and liquid will be drained away via the channel system 74 (see indication L/G). Flexible tubes may be connected to the (channel system 74 of the) stage for further transport of the mixture L/G.

In the example of FIG. 11 each stage (42.1 respectively 42.2) has a channel system (74.1 respectively 74.2), wherein each channel system leads to an opening in a plane surface of the immersion cross edge (72.1 respectively 72.2). In the example of FIG. 10 only the stage 42.2 is provided with a channel system 74, wherein the channel system 74 has three openings in the surface E of the immersion cross edge 72.2. Little arrows in the channel system 74 show the direction of the flow during the joint scan movement.

FIG. 10, 13, 14 show a configuration wherein the stages 42.1, 42.2 are provided with a water gutter 76.1, 76.2 under the immersion cross edges 72.1, 72.2. The water gutter is capable of catching liquid possible dripped along the immersion cross edge before, during and after the joint scan movement. Application of only one water gutter attached to only one of the stages is in principle sufficient for only catching liquid during the joint scan movement.

Figure 8:
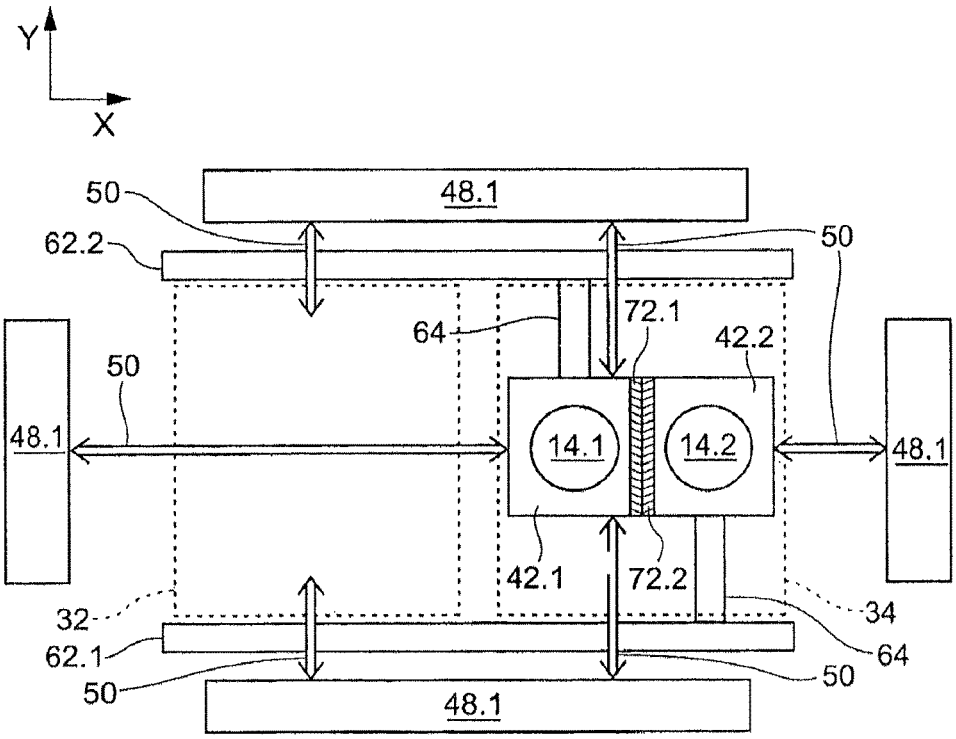
FIG. 8 is a schematic top-view of a third embodiment of the drive and stage configuration of the dual stage immersion lithography apparatus according to FIG. 1A, wherein the lithographic apparatus performs a joint scan movement.
Figure 12:
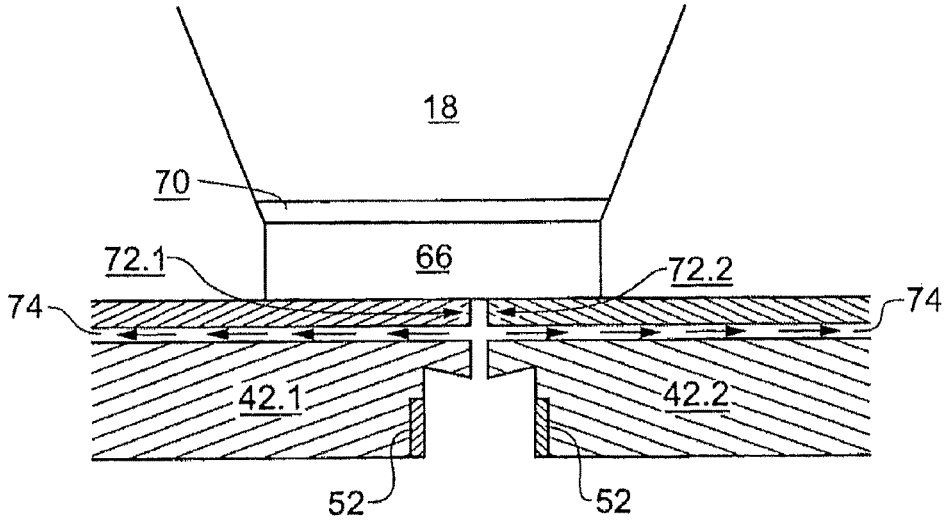
FIG. 12 is a schematic vertical cross section of a third embodiment of the stages in FIG. 9.
Figure 13:
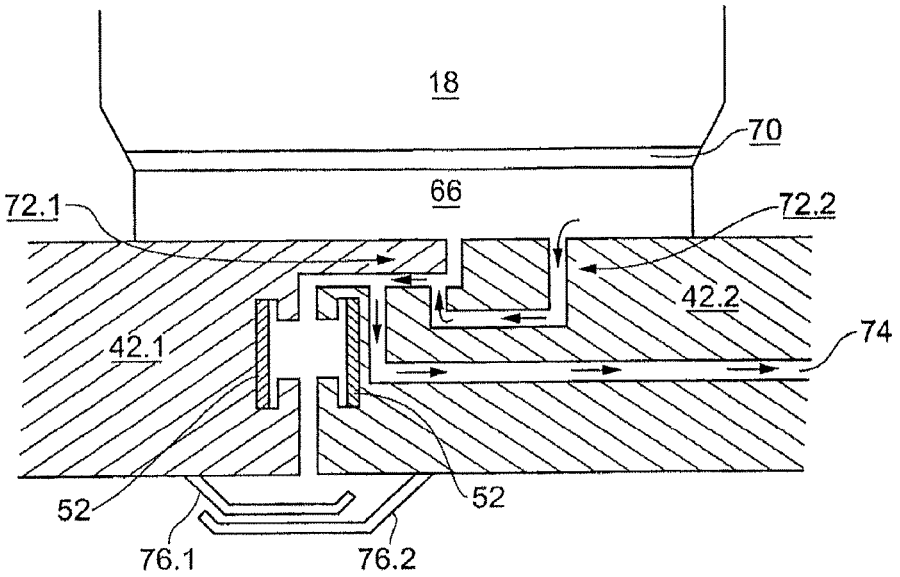
FIG. 13 is a schematic vertical cross section of a fourth embodiment of the stages in FIG. 9.
Figure 14:
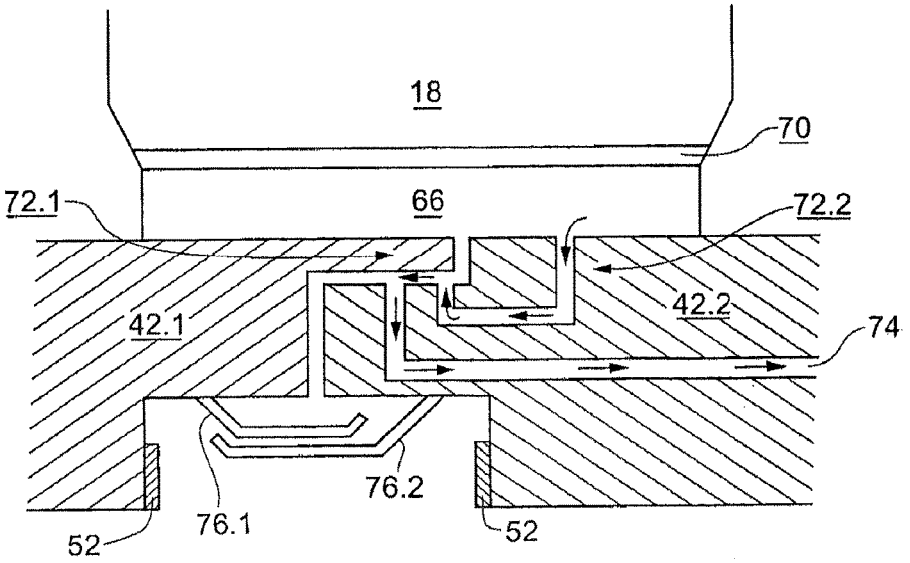
FIG. 14 is a schematic vertical cross section of a fifth embodiment of the stages in FIG. 9.

The said interferometer system 48.1 uses interferometer-mirrors attached to the stages for position measuring. In the example of FIG. 4 it does not make sense for the interferometer system 48.1 to have interferometer mirrors 52 on the stages at the sides of the immersion cross edges. However, for the drive and stage configuration in FIG. 6, it may be advantageous to have an interferometer-mirrors 52 at the stages at the sides of the immersion cross edges (for example to have relative short distances of the interferometer beam, which generally yields relative high measurement accuracies). This also holds for the configuration of FIG. 8, for example in the situation whereby the stage 42.1 visits the exposure station 34 (the immersion cross edge is at the side of the positive X-direction, and in the left X-direction is a relatively long interferometer beam path). In these case it is preferred that the stages are provided with an interferometer-mirror 52 at the immersion cross edge. It is noted that the chance on contamination (liquid flow) and or damage arising during the joint scan movement is greater than for the other interferometer-mirrors. Therefore it is advantageous to stagger the interferometer-mirror with respect to the immersion cross edge as indicated in FIG. 12. As an alternative the interferometer-mirrors 52 are placed it in a protective niche of the stage, as indicated in FIG. 13. Another alternative is to place the interferometer-mirror 52 below the said water gutter 76 which catches liquid (and possible contamination). FIG. 14 shows an example of a combination of the mentioned measures whereby the interferometer-mirrors are both staggered with respect to the immersion cross edge 72 and placed at a level under the water gutter 76. In this way the interferometers stay clean and undamaged which yield a reliable performance of the measurement system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic. electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

[1. A lithographic apparatus comprising:

a support constructed to support a patterning device, the patterning device being capable of imparting a radiation beam with a pattern in its cross-section to form a patterned radiation beam;

a measuring system configured to measure characteristics of substrates in a metrology station of the apparatus;

a projection system configured to project the patterned radiation beam onto a substrate in an exposure station of the apparatus;

a liquid confinement system configured to at least partly confine liquid in a space between the projection system and the substrate;

a positioning system and at least two substrate stages, each stage constructed to hold a substrates, wherein the positioning system is constructed to move the stages between the metrology station and the exposure station, and wherein the positioning system is constructed to position one of the stages holding a substrate during exposure in the exposure station on the basis of at least one measured characteristic of that substrate;

wherein the stages are constructed and arranged for mutual cooperation in order to perform a joint scan movement to bring the lithographic apparatus from a first situation, wherein the liquid is confined between a first substrate held by a first stage of the two stages and the projection system, towards a second situation, wherein the liquid is confined between a second substrate held by a second stage of the two stages and the projection system, such that during the joint scan movement the liquid is essentially confined within the space with respect to the projection system.]

[2. The lithographic apparatus according to claim 1, wherein each of the first stage and second stage has an immersion cross edge at or near a side of the stage which is constructed and arranged to cooperate with an immersion cross edge of another stage during the joint scan movement.]

[3. The lithographic apparatus according to claim 2, wherein each immersion cross edge comprises an essentially plane surface.]

[4. The lithographic apparatus according to claim 2, wherein the positioning system is constructed and arranged to position the respective stages during their joint scan movement such that surfaces of their respective immersion cross edges remain at an essentially mutual constant distance, wherein the distance is in the range of zero to about 1 millimeter, wherein a preferred distance is about 0.1 millimeter.]

[5. The lithographic apparatus according to claim 2, wherein at least one of the respective stages is provided with a channel system having an opening in a surface of the immersion cross edge of the stage, wherein the channel system is constructed and arranged to generate a flow of gas and/or liquid along the immersion cross edge during the joint scan movement.]

[6. The lithographic apparatus according to claim 2, wherein at least one of the respective stages is provided with a liquid gutter under its immersion cross edge, wherein the liquid gutter is capable of catching liquid possibly dripped along the immersion cross edge.]

[7. The lithographic apparatus according to claim 2, wherein at least one of the respective stages is provided with an interferometer-mirror near the immersion cross edge, wherein the interferometer-mirror is staggered with respect to the immersion cross edge and preferably placed in a niche of the stage in order to protect the interferometer-mirror.]

[8. The lithographic apparatus according to claim 6, wherein at least one of the respective stages is provided with an interferometer-mirror near the immersion cross edge, wherein the interferometer-mirror is placed at a level below that of the liquid gutter in order to protect the interferometer-mirror.]

[9. The lithographic apparatus according to claim 1, further comprising an exposure station situated between a first metrology station and a second metrology station such that alternately substrates measured by the first metrology station and substrates measured by the second metrology station may be fed towards the exposure station.]

[10. The lithographic apparatus according to claim 1, further comprising a base frame configured to carry a metro frame which supports the measuring system and the projection system, wherein the metro frame is dynamically isolated from the base frame, and wherein the measuring system comprises at least one encoder plate configured to cooperate with an encoder head placed at one of the stages to measure the position of that stage.]

[11. The lithographic apparatus according to claim 10, wherein the at least one encoder plate extends in the exposure station and the metrology station.]

[12. The lithographic apparatus according to claim 10, further comprising a machine frame which is preferably separated from the base frame, wherein the machine frame is provided with a first part of a planar motor to cooperate with respective second parts of the planar motor in the respective stages, wherein the positioning system is constructed and arranged to control the planar motor in order to position the respective stages between the metrology station and the exposure station.]

[13. The lithographic apparatus according to claim 10, further comprising a machine frame which is preferably separated from the base frame, wherein the machine frame has two essentially parallel guides extending in a first direction in a horizontal plane, wherein each guide is coupled to an element which can be moved along the guide by means of a motor, and wherein each element is coupled to a stage of the respective stages by means of a motor to move that stage in a second direction directed in the horizontal plane and perpendicular to the first direction, wherein the positioning system is constructed and arranged to control the motors in order to move the stage in the plane.]

[14. A lithographic product with a lithographic apparatus according to claim 1.]

*15. A lithographic apparatus, comprising:*

*a first movable stage configured to hold a substrate;*

*a second stage movable with respect to the first stage;*

*a projection system configured to image a pattern onto the substrate;*

*a liquid confinement structure configured to at least partly confine a liquid in a space between a final element of the projection system and the substrate, the first stage, and/or the second stage;*

*an encoder system comprising an encoder plate and an encoder head cooperating with the encoder plate, the encoder system configured to measure a position of the first stage and/or of the second stage in at least a first direction and the encoder system configured to provide radiation to or from a respective surface of the first and/or second stage to measure the position of respectively the first and/or second stage, the respective surface facing toward the projection system; and*

*a positioning system configured to control movement of the first stage and the second stage together relative to the liquid confinement structure such that liquid in the liquid confinement structure is transferred from being confined by the substrate, or the first stage, or both, to being confined by the second stage, the liquid crossing a first edge of the first stage and an opposing second edge of the second stage.*

*16. The lithographic apparatus of claim 15, further comprising a frame supporting at least part of the encoder system, the frame dynamically isolated from the first and second movable stages.*

*17. The lithographic apparatus of claim 16, wherein the frame further supports the projection system.*

*18. The lithographic apparatus of claim 16, wherein the projection system is dynamically isolated from the frame.*

*19. The lithographic apparatus of claim 15, further comprising an interferometer system configured to measure a position of the first stage and/or of the second stage in at least the first direction.*

*20. The lithographic apparatus of claim 15, further comprising an exposure station in which the substrate of the first stage is exposed by the projection system and a metrology station in which measurements are made using the second stage, wherein at least part of the encoder system extends into both the exposure and measurement stations.*

*21. The lithographic apparatus of claim 15, wherein the positioning system is configured to control the movement of the first and second stages together such that a gap between the first and second edges passes under the liquid in the liquid confinement structure and further comprising a fluid extraction channel in or on the first stage, the second stage, or both, the fluid extraction channel constructed and arranged to collect immersion liquid flowing into the gap during the movement of the first and second stages.*

*22. The lithographic apparatus of claim 15, further comprising a channel in the first stage, in the second stage, or in both, that is in fluid communication with an opening defined by a surface of the respective stage, the channel constructed and arranged to generate a fluid flow along the respective first and/or second edge, the fluid flow including liquid from the liquid confinement structure.*

*23. A device manufacturing method, comprising:*

*at least partly confining liquid in a space between a projection system and a first stage, a substrate supported by the first stage, or both; and*

*measuring a position of the first stage and/or of a second movable stage using an encoder system comprising an encoder plate and an encoder head cooperating with the encoder plate, the measuring using the encoder system comprising providing radiation to or from a respective surface of the first and/or second stage to measure the position of respectively the first and/or second stage, the respective surface facing toward the projection system; and*

*jointly moving the first stage with the second stage such that confinement of liquid in the space by the first stage, the substrate, or both, is replaced by confinement of liquid in the space by the second stage.*

*24. The method of claim 23, further comprising supporting at least part of the encoder system using a frame, the frame dynamically isolated from the first and second movable stages.*

*25. The method of claim 24, wherein the frame further supports the projection system.*

*26. The method of claim 24, wherein the projection system is dynamically isolated from the frame.*

*27. The method of claim 23, further comprising measuring a position of the first stage and/or of the second stage in at least the first direction using an interferometer system.*

*28. The method of claim 23, further comprising an exposure station in which the substrate of the first stage is exposed by the projection system and a metrology station in which measurements are made using the second stage,*

*wherein at least part of the encoder system extends into both the exposure and measurement stations.*

*29. The method of claim 23, wherein the jointly moving comprises moving the first and second stages such that a gap between respective opposing edges of the first and second stages passes under the confined liquid and further comprising collecting immersion liquid flowing into the gap during the movement of the first and second stages using a fluid extraction channel in or on the first stage, the second stage, or both.*

*30. The method of claim 23, further comprising generating a fluid flow, including at some of the liquid, along a first edge of the first stage and/or a second edge of the second stage using a channel in the first stage, in the second stage, or in both, that is in fluid communication with an opening defined by a surface of the respective stage.*

*31. A lithographic apparatus, comprising:*

*a first movable stage configured to hold a substrate;*

*a second stage movable with respect to the first stage;*

*a projection system configured to image a pattern onto the substrate;*

*a liquid confinement system configured to at least partly confine a liquid in a space between a final element of the projection system and the substrate, the first stage, and/or the second stage;*

*an optical encoder system configured to measure a position of at least the first stage in at least a first direction, the encoder system comprising a first part located above the first stage and a second part located in or on the first stage, the second part facing upwardly toward the first part; and*

*a positioning system configured to control movement of the first stage and the second stage together relative to the liquid confinement system such that liquid in the liquid confinement structure is transferred from being confined by the substrate, or the first stage, or both, to being confined by the second stage, the liquid crossing an edge of the first stage and an opposing edge of the second stage.*

*32. The lithographic apparatus of claim 31, further comprising a frame supporting the first part of the encoder system, the frame dynamically isolated from the first and second movable stages.*

*33. The lithographic apparatus of claim 32, wherein the projection system is dynamically isolated from the frame.*

*34. The lithographic apparatus of claim 31, further comprising an interferometer system configured to measure a position of the first stage and/or of the second stage in at least the first direction.*

* * * * *